United States Patent
Chao et al.

(10) Patent No.: US 7,030,552 B2
(45) Date of Patent: Apr. 18, 2006

(54) DUAL-SCREEN ORGANIC ELECTROLUMINESCENT DISPLAY

(75) Inventors: Ching-Ian Chao, Hsinchu (TW); En-Chung Chang, Hsinchu (TW); Shih-Kuei Lo, Hsinchu (TW)

(73) Assignees: Industrial Technology Research Institute, Hsinchu (TW); Worldled Co., Ltd., Taichung (TW)

( * ) Notice: Subject to any disclaimer, the term of this patent is extended or adjusted under 35 U.S.C. 154(b) by 219 days.

(21) Appl. No.: 10/627,744

(22) Filed: Jul. 28, 2003

(65) Prior Publication Data

US 2004/0212300 A1 Oct. 28, 2004

(30) Foreign Application Priority Data

Apr. 25, 2003 (TW) .............................. 92109750 A

(51) Int. Cl.
*H05B 33/00* (2006.01)

(52) U.S. Cl. ...................... 313/504; 313/506; 313/1; 313/512

(58) Field of Classification Search ................ 313/506, 313/1, 502, 504, 512, 509; 428/917; 315/169.3; 345/1, 36, 45, 76
See application file for complete search history.

(56) References Cited

U.S. PATENT DOCUMENTS

| | | | | |
|---|---|---|---|---|
| 5,198,723 | A * | 3/1993 | Parker ........................ | 313/634 |
| 6,861,162 | B1 * | 3/2005 | Lee et al. ................. | 530/350 |
| 6,869,693 | B1 * | 3/2005 | Fryd et al. .................. | 428/690 |
| 2004/0075628 | A1 * | 4/2004 | Chien et al. .................. | 345/82 |

* cited by examiner

*Primary Examiner*—Ashok Patel
(74) *Attorney, Agent, or Firm*—Birch, Stewart, Kolasch & Birch, LLP

(57) ABSTRACT

A dual-screen organic electroluminescent display device is made by encapsulating two independent conventional organic electroluminescent displays inside two substrates to reduce its weight and thickness. Meanwhile, only one encapsulation step is carried out and encapsulation cost would be lower.

18 Claims, 1 Drawing Sheet

DUAL-SCREEN ORGANIC ELECTROLUMINESCENT DISPLAY

BACKGROUND OF THE INVENTION

1. Field of Invention

The present invention relates to a dual-screen display, and more particularly to a dual-screen organic electroluminescent display.

2. Related Art

As information transmission and electronic appliances are developed, particular attention is paid to the improvements in the response speed, the resolution and the image quality. A dual-screen display device is increasingly used in a portable electronic appliance such as a folding mobile phone, a personal digital assistant and a laptop computer. The dual-screen display device allows image expansion, which results in a wider perspective and enables multi-image display. To satisfy the demand of lightweight and small size, the weight and the thickness of the electronic appliance are design key-factors for display device manufactures. Currently, commercially available display devices used in a portable electronic appliance include a super twisted nematic liquid crystal display (STN-LCD) and a thin film transistor LCD (TFT-LCD).

In a dual-screen display device having two display panels, two output devices (display panels) could be simultaneously driven. Usually, the display panels are individually packaged and then back-to-back assembled. For a 2×2 inch glass panel with a backlight (a FPC and a driver IC are not included), the assembly typically has thickness of about 8–10 mm and a weight of about 33 g–38 g. A recently developed organic electro luminescent display (OELD) device becomes attractive due to advantageous characteristics such as a self-illumination, no need of backlight and color filters, being lightweight, and being thin, a simplified construction, durability and being produced with low manufacture cost. Therefore, an association of the LCD and the OELD has been proposed in the art to manufacture a dual-screen display device. In such an association, an OELD and a LCD component are back-to-back assembled. An assembly of a 2×2 inch glass panel with a backlight (a FPC and a driver IC are not included) has a thickness of about 6–8 mm and a weight of about 30 g–34 g. In the structures above, the dual-display devices need individual packaging and then are assembled together. Therefore, the size and the manufacture cost of the assembly are equal to the summation of those of two single-display devices. There is not any improvement in reducing the weight and the thickness of the assembly in current dual-screen display devices.

SUMMARY OF THE INVENTION

In order to overcome the disadvantages of the prior art, the invention provides a dual-screen organic electroluminescent display device in which two organic electro luminescent display panels are encapsulated into a single body. Thus the amount of substrate used in packaging of the organic electroluminescent display device is reduced. Furthermore, the weight and the size of the display device are advantageously reduced. There are lower manufacture costs as well.

The organic electroluminescent display device of the invention includes two bottom-emission organic electroluminescent display panels. One bottom-emission organic electroluminescent display panel includes a transparent substrate, a plurality of organic electroluminescent elements and an insulation layer. The organic electroluminescent elements are formed on the transparent substrate and include a plurality of organic electroluminescent materials, a plurality of transparent electrodes and a plurality of metallic electrodes. The transparent electrodes and the metallic electrodes are respectively mounted on opposite sides of the organic electroluminescent materials, the transparent electrodes are attached to the transparent substrate while the metallic electrodes covered by the insulation layer, to realize an organic electroluminescent display panel. Light emission from the organic electroluminescent materials are achieved by means of applying an external voltage. Two bottom-emission organic electroluminescent display panels are assembled facing each other with adhesive material, and then are subjected to an encapsulation.

In a variant embodiment of the invention, a bottom-emission organic electroluminescent element is formed on a transparent substrate and emits the light through the transparent substrate. An insulation layer is formed over the bottom-emission organic electroluminescent element. A top-emission organic electroluminescent element is formed on the insulation layer. Thereafter, a transparent lid covers the top-emission organic electroluminescent element. Then, an encapsulation is performed to complete the dual-screen organic electroluminescent display device. According to the practical demand, these two organic electroluminescent display panels could be driven by two passive matrices, two active matrices or a combination mode of a passive matrix and an active matrix. The organic electroluminescent display device of the invention is suitable for monochromic, multichromic or full color display panel.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent from this detailed description to those skilled in the art.

BRIEF DESCRIPTION OF THE DRAWINGS

The present invention will become more fully understood from the detailed description given herein below illustration only, and is thus not limitative of the present invention.

DETAILED DESCRIPTION OF THE INVENTION

Figure 1:
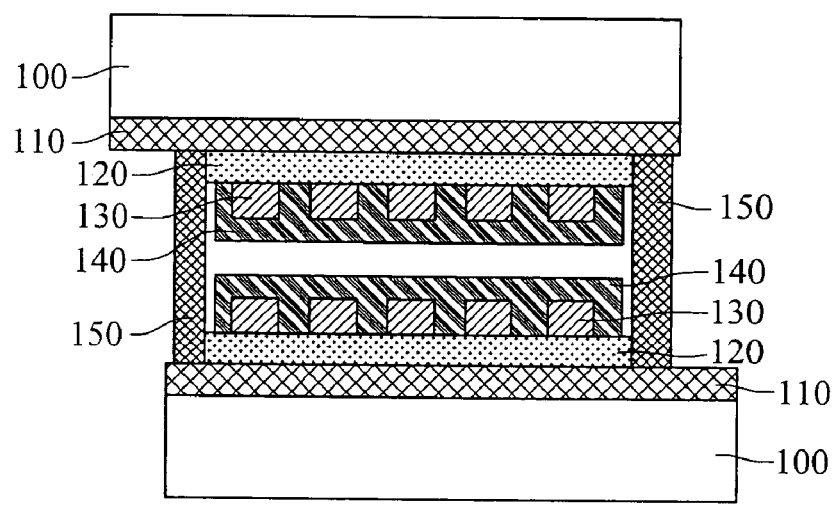
FIG. 1 is a schematic view of a dual-screen organic electroluminescent display device according to a first embodiment of the invention.

The invention provides a dual-screen organic electroluminescent display device including two bottom-emission organic electroluminescent display panels. Referring to FIG. 1, illustrating a first embodiment of the invention, a bottom-emission organic electroluminescent display panel includes a transparent substrate 100, an organic electro-luminescent element and an insulation layer 140. The organic electroluminescent element is formed on the transparent substrate 100 and covered by the insulation layer 140. The organic electroluminescent element includes a plurality of organic electroluminescent materials 120, a plurality of transparent electrodes 110 and a plurality of metallic electrodes 130. The transparent electrodes 110 and the metallic electrodes 130 are respectively formed on opposite sides of the organic electroluminescent materials 120. The transparent electrodes are attached to the transparent substrate while the metallic electrodes are covered by the insulation layer to realize a single organic electroluminescent display panel. In this embodiment, the transparent electrodes 110 are first formed on the transparent substrate 100. Then, a plurality of organic electroluminescent materials 120 is deposited on the transparent electrodes 110. In order to get a good-performance organic electroluminescent element, the organic electroluminescent materials can choose from the electron hole injecting layer, the electron hole transport layer, the emitting layer, the electron transport layer, the electron injecting layer and the charge generating layer. The metallic electrodes 130 are formed on the organic electroluminance material 120, and the insulation layer 140 covers the metallic electrodes 130. Thereby, one bottom-emission organic electroluminescent display panel is accomplished. Two of the bottom-emission organic electroluminescent display panels above are further positioned face to face and then encapsulated with an UV-curing epoxy 150 to form the dual-screen organic electroluminescent display device.

Figure 2:
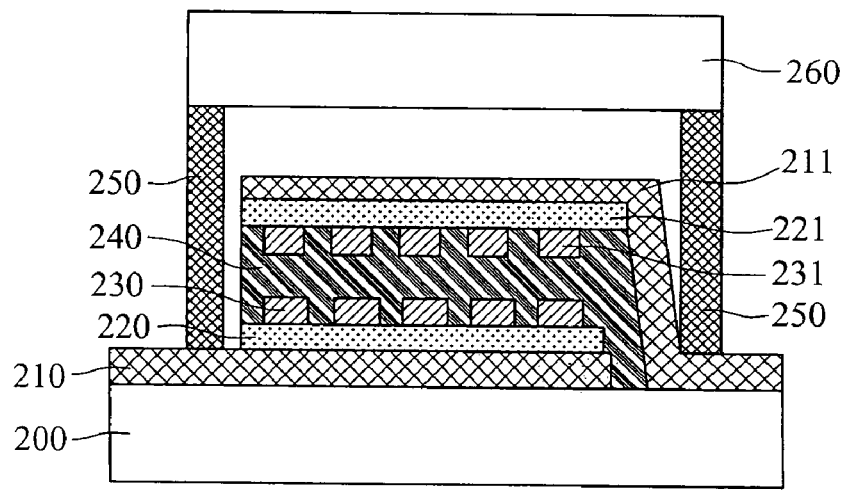
FIG. 2 is a schematic view of a dual-screen organic electroluminescent display device according to a second embodiment of the invention.

Alternatively, two display panels can be formed on one transparent substrate and encapsulated by a transparent lid. FIG. 2 is a schematic view of a dual-screen organic electroluminescent display device according to a second embodiment of the invention. In this embodiment, the dual-screen organic electroluminescent display device includes a transparent substrate 200, a top-emission organic electroluminescent element, a bottom-emission organic electroluminescent element, an insulation layer 240, and a transparent lid 260. A plurality of transparent electrodes 210 is formed on the transparent substrate 200. Then, a plurality of bottom-emission organic electroluminescent materials 220 is deposited on the transparent electrodes 210. In order to get a good-performance organic electroluminescent element, the organic electroluminescent materials can choose from the electron hole injecting layer, the electron hole transport layer, the emitting layer, the electron transport layer, the electron injecting layer and the charge generating layer. A plurality of metallic electrodes 230 is formed on the organic electroluminescent materials 220 to form the bottom-emission organic electro-luminescent element, which then is covered by the insulation layer 240. The top-emission organic electroluminescent element, which includes a plurality of metallic electrodes 231, a plurality of organic electroluminescent materials 221 and a plurality of transparent electrodes 211 subsequently formed on one another, is stacked on the insulation layer 240. The transparent electrodes 211 and the metallic electrodes 231 are respectively formed on opposite sides of the organic electroluminescent materials 221. The plurality of organic electroluminescent materials 221 can include an electronic hole injecting layer, an electronic hole transport layer, an emitting layer, an electron transport layer, an electron injecting layer, a charge generating layer, etc. The UV-curing epoxy 250 and a transparent lid 260 are used to encapsulate the display panels to realize the dual-screen organic electroluminescent display device.

Each of the transparent electrodes can be made of a transparent conductive material such as indium tin oxide (ITO) or indium zinc oxide (IZO), or a thin metal layer. The transparent substrate is made of glass or plastics, for example. The insulation layer covering the metallic electrodes has a dark or black color to avoid light crosstalk.

According to the practical demand, these two organic electroluminescent display panels could be driven by two passive matrices, two active matrices or a combination mode of a passive matrix and an active matrix. In the display device of the invention, a 2×2 inch glass panel has a thickness that is reduced to the range of about 1.5 mm to 3 mm, and its weight is reduced to the range of about 15 g to 17 g. Furthermore, only one encapsulation step is required to encapsulate the display panels, which efficiently reduces the manufacture cost. Compared to the prior art, as shown in table 1, the thickness of the display device according to the invention is about ⅓ of that of the prior art. Similarly, the weight and the package cost of the display device according to the invention are about ½ of that of the prior art.

TABLE 1

Comparison of properties of a 2 × 2 inch dual-screen display device

| | Thickness (mm) | Weight (g) | Number of molding step |
|---|---|---|---|
| LCD with LCD package (comparison 1) | 8–10 | 33–38 | Twice |
| LCD with OELD package (comparison 2) | 6–8 | 30–24 | Twice |
| The invention | 1.5–3 | 15–17 | Once |

Reading the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A dual-screen organic electroluminescent display device, comprising:

two bottom-emission organic electroluminescent display panels, each including:

a transparent substrate;

an organic electroluminescent element, formed on the transparent substrate, wherein the organic electroluminescent element includes a plurality of organic electroluminescent materials, a plurality of transparent electrodes and a plurality of metallic electrodes, the transparent electrodes and the metallic electrodes being respectively formed on opposite sides of the organic electroluminescent materials;

an insulation layer, formed over the organic electroluminescent element to cover the metallic electrodes; and an adhesive material, the two bottom-emission organic electroluminescent display panels facing each other and being encapsulated together by the adhesive material to form a single piece;

wherein the light emitted from the organic electroluminescent element travels through the transparent substrate, and the transparent substrate of each organic electroluminescent display panel is used as a display side.

2. The dual-screen organic electroluminescent display device of claim 1, wherein the organic electroluminescent materials chosen from the electronic hole injecting layer, the electronic hole transport layer, the emitting layer, the electron transport layer, the electron injecting layer and the charge generating layer.

3. The dual-screen organic electroluminescent display device of claim 1, wherein each transparent electrode is made of indium tin oxide (ITO), indium zinc oxide (IZO), or a thin metal layer.

4. The dual-screen organic electroluminescent display device of claim 1, wherein the transparent substrate material is one of glass and plastics.

5. The dual-screen organic electroluminescent display device of claim 1, wherein the adhesive material is an UV-curing epoxy.

6. The dual-screen organic electroluminescent display device of claim 1, wherein the bottom-emission organic electroluminescent display panels are driven by two passive matrices, two active matrices or a combination mode of a passive matrix and an active matrix.

7. The dual-screen organic electroluminescent display device of claim 6, wherein the bottom-emission organic electroluminescent display panels are driven according to an active matrix.

8. The dual-screen organic electroluminescent display device of claim 6, wherein the top-emission organic electroluminescent display panels are driven according to a passive matrix.

9. The dual-screen organic electroluminescent display device of claim 1, wherein the two bottom-emission organic electroluminescent display panels encapsulated by the adhesive material together are non-movable relative to each other.

10. The dual-screen organic electroluminescent display device of claim 1, wherein the adhesive material encapsulates the metallic electrodes of the two bottom-emission organic electroluminescent display panels in a single space.

11. The dual-screen organic electroluminescent display device of claim 10, wherein the adhesive material encapsulates the organic electroluminescent materials of the two bottom-emission organic electroluminescent display panels in the single space.

12. The dual-screen organic electroluminescent display device of claim 1, wherein the adhesive material encapsulates the organic electroluminescent materials of the two bottom-emission organic electroluminescent display panels in a single space.

13. A dual-screen organic electroluminescent display device, comprising:
a top-emission organic electroluminescent element and a bottom-emission organic electroluminescent element, wherein each of the top-emission organic electroluminescent element and bottom-emission organic electroluminescent elements includes a plurality of organic electroluminescent materials, a plurality of transparent electrodes and a plurality of metallic electrodes, the transparent electrodes and the metallic electrodes being respectively formed on opposite sides of the organic electroluminescent materials;
a transparent substrate, over which the bottom-emission organic electroluminescent element organic electroluminescent element is formed, the transparent electrodes being attached on the transparent substrate;
an insulation layer, formed over the bottom-emission organic electroluminescent element to cover the metallic electrodes, the top-emission organic electroluminescent element being located above the insulation layer, and the metallic electrodes being attached on the insulation layer;
a transparent lid, mounted on the top-emission organic electroluminescent element; and
an adhesive material, filled between the transparent substrate and the transparent lid,
wherein the light emitted from the bottom-emission organic electroluminescent element travels through the transparent substrate, and the transparent substrate and the transparent lid are used as two independent display screens, while the light emitted from the top-emission organic electroluminescent element travels through the transparent lid.

14. The dual-screen organic electroluminescent display device of claim 6, wherein the organic electroluminescent materials can choose from the electronic hole injecting layer, the electronic hole transport layer, the emitting layer, the electron transport layer, the electron injecting layer and the charge generating layer.

15. The dual-screen organic electroluminescent display device of claim 6, wherein each transparent electrode is made of indium tin oxide (ITO), indium zinc oxide (IZO), or a thin metal layer.

16. The dual-screen organic electroluminescent display device of claim 6, wherein the transparent substrate material is one of glass and plastics.

17. The dual-screen organic electroluminescent display device of claim 6, wherein the adhesive material is an UV-curing epoxy.

18. The dual-screen organic electroluminescent display device of claim 6, wherein the bottom-emission organic electroluminescent display panels are driven according to a passive matrix.

* * * * *